United States Patent [19]

Takada et al.

[11] Patent Number: 5,045,353
[45] Date of Patent: Sep. 3, 1991

[54] METHOD FOR TREATING INTERIOR SURFACES OF HOLES AND APPARATUS THEREFOR

[75] Inventors: Yuuzi Takada; Ritsuji Toba; Satoshi Yoshitomi; Nobuaki Ooki, all of Hadano, Japan

[73] Assignee: Hitachi, Ltd., Tokyo, Japan

[21] Appl. No.: 413,383

[22] Filed: Sep. 27, 1989

[30] Foreign Application Priority Data

Sep. 28, 1988 [JP] Japan .................. 63-241107
Mar. 15, 1989 [JP] Japan .................. 01-062956

[51] Int. Cl.$^5$ .................................................. B05D 5/00
[52] U.S. Cl. .................................... 427/243; 118/423; 118/424; 118/425; 118/428; 118/500; 427/97; 427/98; 427/443.1; 427/443.2
[58] Field of Search ............. 427/97, 98, 243, 443.1, 427/443.2; 118/423, 425–428, 500

[56] References Cited

U.S. PATENT DOCUMENTS 4,064,290 12/1977 Ebel et al. ..................... 427/97
4,622,917 11/1986 Schramm ..................... 427/97

FOREIGN PATENT DOCUMENTS 61-46559 10/1986 Japan .
62-29518 6/1987 Japan .
62-34837 7/1987 Japan .
62-37840 8/1987 Japan .

Primary Examiner—Janyce Bell
Attorney, Agent, or Firm—Kenyon & Kenyon

[57] ABSTRACT

A method for treating the interior surfaces of holes as well as the surfaces of a perforated workpiece by dipping it into treating liquid includes a step of causing treating liquid to flow at both ends of the holes in a direction perpendicular to these holes at different velocities. In order to create these liquid flows at different velocities, the workpiece is dipped in the liquid so that the holes extend substantially horizontally, and air bubble jets are alternately delivered along both ends of the holes, or fins are provided at locations adjacent both ends of the holes so as to extend outwardly upwardly at one side of the hole ends and extend outwardly downwardly at the other side of the hole ends, and these fins are moved upwardly and downwardly.

8 Claims, 3 Drawing Sheets

METHOD FOR TREATING INTERIOR SURFACES OF HOLES AND APPARATUS THEREFOR

BACKGROUND OF THE INVENTION

1. Field of the Invention

The present invention relates to a method for treating the interior surfaces of microscopic penetrating holes provided on a workpiece and, more particularly, to treatment of through holes of a printed circuit board.

2. Description of the Related Art

Recently, as electronic instruments have been developed to further improve operation speed and calculation capacity, printed circuit boards used for system boards, memory boards or the like have been increasingly required to have accordingly higher circuit density. Owing to such a density increase each printed circuit board is laminated to have the layers further multiplied and thickened, and the through holes for electrically connecting these layers with one another must be reduced in diameter. As a result, it is difficult to realize the requisite condition by subjecting the interior surface of each small-diameter hole to chemical treatment such as plating. Especially in plating of the through holes, plating precipitation is interfered with by residual air in the through holes when dipping the workpiece into treating liquid and by gas and reaction products generated and remaining within the through holes during the treatment. This results in such problems as plating voids and decreases of plating thicknesses at the intermediate areas of the holes i.e., an insufficient plating condition of the inner surface of the through holes. Conventionally, in order to solve these problems, there have been known such methods as disclosed in Japanese Examined Patent Publication No. 61-13399, Japanese Unexamined Patent Publication No. 61-163695, Japanese Examined Patent Publication No. 61-46559, Japanese Examined Utility Model Publication No. 62-1240, and Japanese Examined Patent Publication Nos. 62-29518, 62-34837, and 62-37840.

Among these publications, the method disclosed in Japanese Examined Patent Publication No. 61-13399 is known for facilitating uniform plating of the interior surfaces of extremely thin through holes not only by controlling flows of plating liquid toward these through holes but also by regulating a distance from the electrode according to measurements of precipitation voltage and current.

In addition to this method, the method disclosed in Japanese Unexamined Patent Publication No. 61-163695 is known for supplying treating liquid directly into through holes of a printed circuit board and circulating the treating liquid through them.

In these conventional methods, however, in spite of the direct supply of liquid flows into the through holes the smallness of the hole diameter has brought about the difficulty of allowing the liquid to flow at sufficient speed, and furthermore, residual air within the through holes and remaining gas and reaction products generated during the treatment have been hard to thoroughly remove.

Besides, in this condition, the interior surfaces of the through holes have not been treated uniformly, and decreases of plating thicknesses at the intermediate areas of the holes have not been completely prevented.

Furthermore, among the above publications, in the method disclosed in Japanese Examined Patent Publication No. 61-46559, multi-fins are provided at both sides of a board to be treated, and repeatedly moved upwardly and downwardly at regular intervals to uniformly stir treating liquid, but such stirring only causes random liquid flows, which are not adequate for urging regular replacement of the treating liquid in through holes.

In another method, the treating liquid is directly delivered into the holes of the board to be treated, but it is difficult to apply this method to high-density printed circuit boards each including thousands to tens of thousands of through holes.

Further, in a different method, pressure is exerted to the treating liquid for delivering it from one surface to the other surface of the board to be treated. This method has such problems that the apparatus becomes larger and more complicated, and that when the board in question includes holes of different diameters, holes of smaller diameters are difficult for the treating liquid to flow through.

Now, the problems will be concretely explained with reference to the attached drawings. As shown in FIG. 5, a laminated board 1 having a thickness of 7 mm, through which holes 2 having a diameter of 0.3 mm penetrate, is held within a board cage 10, and dipped in thick-covering chemical copper plating liquid 12 available from the market for subjecting the holes to copper plating treatment in a plating tank 11. After the plating treatment with a desired value of a plating thickness being 30 $\mu$m, when several sample pieces are cut out of the laminated board 1 for sectionally observing the thin holes 2, it is found that approximately 10% of the total holes of the treated laminated board have insufficient precipitation where plating thicknesses are below the predetermined thickness of 30 $\mu$m (the covering ratios are as inferior as 50% or so). An example of thus observed insufficient precipitation 12', 12" is shown in an explanatory view of FIG. 6.

SUMMARY OF THE INVENTION

The present invention provides a method which enables treatment or particularly a plating treatment of the interior surfaces of smalldiameter through holes so as to solve the abovementioned problems of the conventional methods.

The inventors of the present invention have realized utility of such a phenomenon that when liquid flows at both ends of a hole to be treated have different velocities in a direction perpendicular to the hole, pressures at both ends become different according to the difference of the flow velocities, and as a result, the liquid is caused to flow within the hole from one end of a higher pressure to the other end of a lower pressure.

In the present invention, the difference between the pressures at both ends of each hole are arranged by alternately supplying air bubble jets along both ends of the hole. This effect is similarly obtained by repeatedly moving plate-like fins upwardly and downwardly in place of the air bubble jets. It is also effective to jet the liquid from nozzles located within the treating tank instead of the air bubbles. The effect is further obtained by locating a workpiece in a structure provided with plate-like fins and by moving this finned structure upwardly and downwardly within the treating liquid.

Since the liquid flows at both ends of the hole have different velocities, the liquid is caused to flow within the hole from one end of a higher pressure to the other end of a lower pressure, and the liquid satisfactorily penetrates the hole.

Besides, in the present invention, a holding member adapted to be dipped in the liquid not only serves to hold the workpiece, but also includes plate-like fins at locations adjacent both ends of the holes of the workpiece, with the fins adjacent one side of the hole ends extending outwardly upwardly with respect to the holes, and the fins adjacent the other side of the hole ends extending outwardly downwardly with respect to the holes, and when the holding member is repeatedly moved together with the workpiece within the treating liquid, the workpiece is shifted to a different holding position relative to the holding member at least once.

In the above-described arrangement, the liquid is caused to flow at both ends of the through holes to be treated due to the function of the fins in accordance with the repeated movements of the holding member of the workpiece, and these liquid flows are changed by shifting the holding position of the workpiece, so as to ensure the circulation of the treating liquid through the through holes to be treated, and enable the uniform treatment of the interior surfaces of these through holes by the treating liquid.

DETAILED DESCRIPTION

One embodiment of the present invention will be hereinafter explained with reference to the attached drawings.

Figure 1:
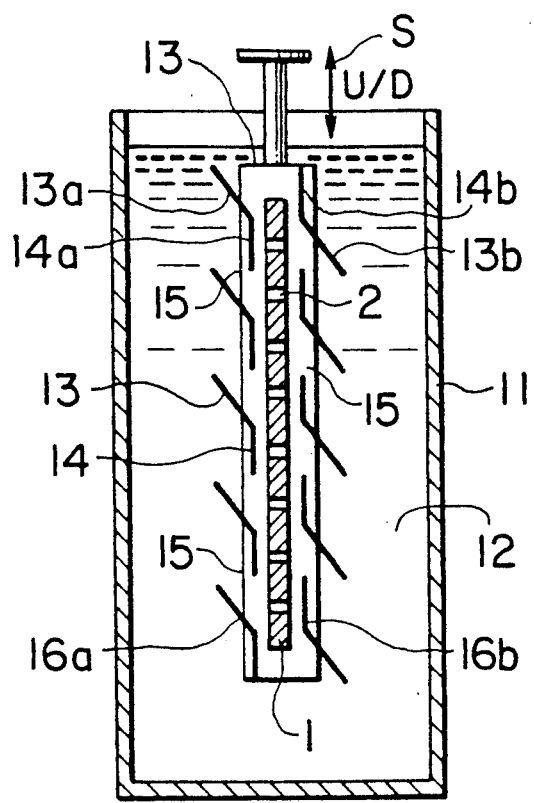
FIG. 1 is an explanatory sectional view showing one embodiment of the present invention.

FIG. 1 is a cross-sectional view of a plating tank 11 for electroless plating, wherein reference numeral 1 denotes a laminated board through which a plurality of through holes 2 penetrate, 13 a finned rack for holding the laminated board 1, and 12 plating liquid which contains a reducing agent given as an electrode.

Figure 2:
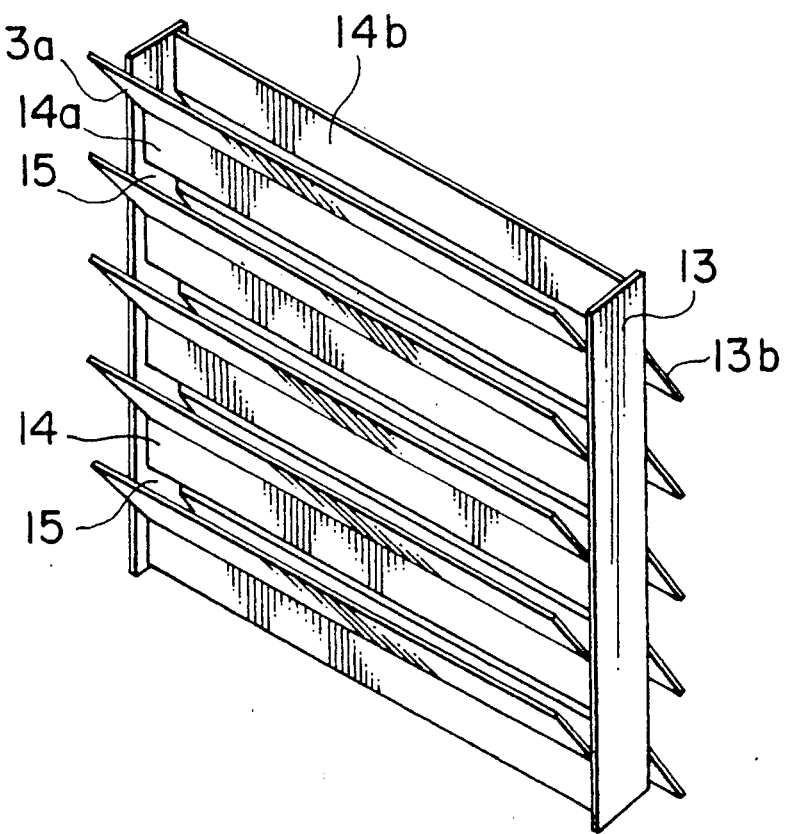
FIG. 2 is a perspective view showing a board holding member constituting the embodiment of the present invention.

FIG. 2 is a perspective view of the finned cage 13 which serves as a holding member for holding a workpiece of the laminated board 1. Referring to the finned cage 13 shown in FIG. 1 as well, fins 13a extend outwardly upwardly, and fins 13b extend outwardly downwardly. Crossbars 14 are located in parallel to each other for the laminated board 1 to be interposed therebetween, of which crossbeams 14a are connected to the fins 13a, while crossbeams 14b are connected to the fins 13b. The fins 13a are located opposite to the crossbeams 14b, and the fins 13b are located opposite to the crossbeams 14a. The finned cage 13 is provided at both sides with side plates perpendicular to the fins 13a, 13b, but the top and bottom thereof are open.

As illustrated in FIG. 1, the laminated board 1 such as a printed circuit board including the through holes 2 is held within the finned cage 13, and this finned cage 13 is intermittently moved upwardly and downwardly in the plating liquid 12. When the cage 13 is moved upwardly in the plating liquid 12, the plating liquid 12 moves along the fins 13a and the crossbeams 14a connected hereto, passes through windows 15 which define open spaces between the crossbeams 14a adjacent to one another, and flows into the inside of the cage 13, so that a flow of the liquid moving along one side of the board 1, which faces the fins 13a and the crossbeams 14a, becomes faster than a flow of the liquid moving along the other side of the board 1 which faces the fins 13b and the crossbeams 14b, thereby causing flow velocity difference, i.e., pressure difference between these flows of the liquid flowing at both sides of the board 1. On the other hand, when the cage 13 is moved downwardly, the plating liquid 12 moves along the fins 13b and the crossbeams 14b connected hereto, and flows into the inside of the cage 13, so that the flow of the liquid moving along the side of the board 1, which faces the fins 13b and the crossbeams 14b, becomes faster than the flow of the liquid moving along the opposite side of the board 1 which faces the fins 13a and the crossbeams 14a, thereby likewise causing flow velocity difference or pressure difference between these flows of the liquid flowing at both sides of the board 1. Consequently, the plating liquid 12 is forced to flow in the through holes 2 and fully pass through them.

When the above-stated finned cage 13 is employed to perform copper plating of the board 1 according to the method described previously, there is sufficient plating precipitation (sufficient of covering ratio) in the through holes 2.

Figure 3:
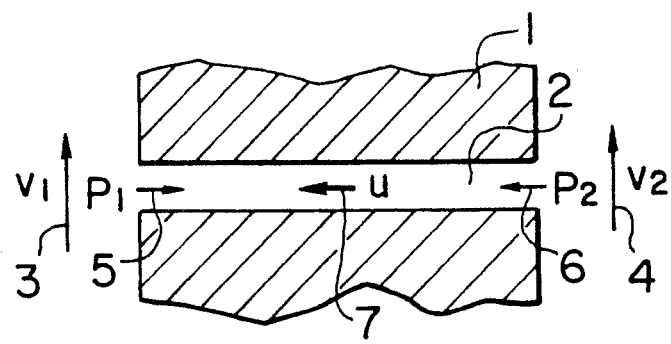
FIG. 3 is a sectional view of a hole for illustrating a principle of the present invention.
Figure 5:
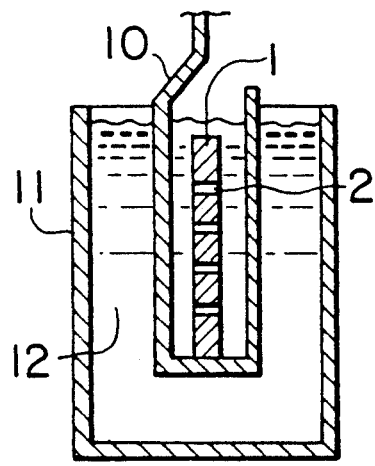
FIG. 5 is an explanatory sectional view showing the conventional plating method of a sample board.
Figure 6:
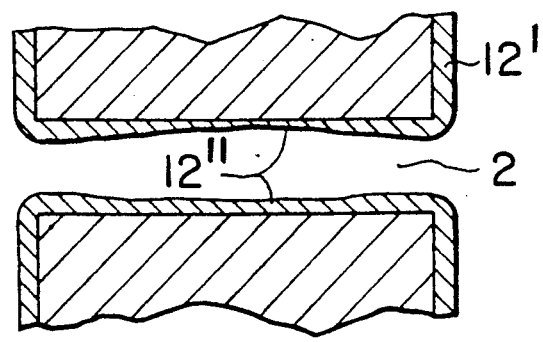
FIG. 6 is a sectional view showing insufficient plating precipitation within a hole caused by the conventional plating method.

The principle of the present invention will now be explained with reference to FIG. 3. FIG. 3 sectionally shows one of the holes to be treated, which hole is set in the treating liquid so as to extend horizontally in parallel with the surface of the liquid. Flow velocities of the liquid flowing at both ends of the through hole 2 along a direction perpendicular to the hole 2 are expressed as $V_1$, $V_2$ indicated by arrows 3, 4, and pressures relative to the respective flow velocities are expressed as $P_1$, $P_2$ indicated by arrows 5, 6, with $\Delta Pf$ representing a difference between $P_1$ and $P_2$. According to Bernoulli's theorem, the following formula is obtained:

$$\frac{V_1^2}{2gc} + \frac{P_1}{\rho} + \frac{g}{gc} Z_1 = \frac{V_2^2}{2gc} + \frac{P_2}{\rho} + \frac{g}{gc} Z_2 \quad (1)$$

In this formula, $V_1^2/2gc$ is a velocity head; $P/\rho$ is a pressure head; and $(g/gc) \cdot Z$ is a position head. With $\Delta V$ representing a difference between $V_1$ and $V_2$, under the conditions of $V_2 = 0, Z_1 = Z_1$, the formula (1) is modified as follows:

$$\Delta Pf = \Delta V^2 \times \rho/2\, gc \quad (2)$$

The differential pressure defined as the formula (2) is caused between the pressures at both ends of the through hole 2 so that the liquid flows from one side of a higher pressure to the other side of a lower pressure. When a flow velocity in the through hole 2 is expressed as U [m/s] indicated by an arrow 7, U can be obtained by substituting $\Delta Pf$ of the formula (2) for the following formula according to Hagen-Poiseuille's law:

$$\Delta Pf = \frac{32 \cdot \mu \cdot l \cdot U}{gc \cdot D^2} \quad (3)$$

where $\mu$ is a coefficient of viscosity [kg/m·s];
l is a hole length [m]; and
D is a corresponding diameter [m]

The formula (2) substituted for the formula (3) is simplified as follows:

$$U = \frac{D^2 \cdot \Delta V^2 \cdot P}{64 \cdot \mu \cdot l} \quad (4)$$

The liquid 12 flows in the hole 2 at the speed U. By this flow of the liquid 12, gas remaining in the hole 2, and gas products, by-products or the like which have been generated in reaction of the liquid 12 in the hole 2 are removed out of the hole, and the liquid in the hole is replaced by flow-in liquid, so that the interior surface of the hole can be uniformly treated by the liquid.

Moreover, in one alternative of the present invention, instead of using the finned cage 13, air bubble jets may be delivered from the bottom side of the board 1 so as to flow over ends of the through holes 2 on either side of the board 1 dipped in the plating liquid 12. These air bubble jets cause the plating liquid 12 to flow, and the flow velocity of the plating liquid 12 is accelerated. Although it is desirable to alternately jet the air bubbles along both side surfaces of the board 1, jetting the bubbles only on one side of the through holes 2 may also take effect of the present invention to some extent.

In a further alternative of the present invention, in place of the finned cage 13, two sets of nozzles may be installed below the board 1 dipped in the plating liquid 12, opposite to both side surfaces of the board 1 to supply jet streams of the plating liquid 12, so that the plating liquid 12 forcedly moves along both ends of the through holes 2 of the board 1 at an appropriate flow velocity. Although it is desirable that the plating liquid 12 from the nozzles is alternately jetted along both side surfaces of the board 1, jetting the liquid only on one side of the holes 2 may similarly take effect of the present invention to some extent.

Besides, even if the finned cage 13 is only provided with the fins 13a on one side of the board 1, it may be effective enough in the present invention.

In the above-described structure, because the treating liquid at both ends of the thin penetrating holes through the board to be treated is arranged to have different pressures, the liquid in the through holes is forced to flow due to this difference of the pressures, so that air bubbles and gas can be prevented from remaining within the through holes, and that the treating liquid in these holes can be replaced with the new liquid every time the liquid flows in, thereby causing the small diameter through holes to be uniformly plated or treated with the liquid.

Figure 4:
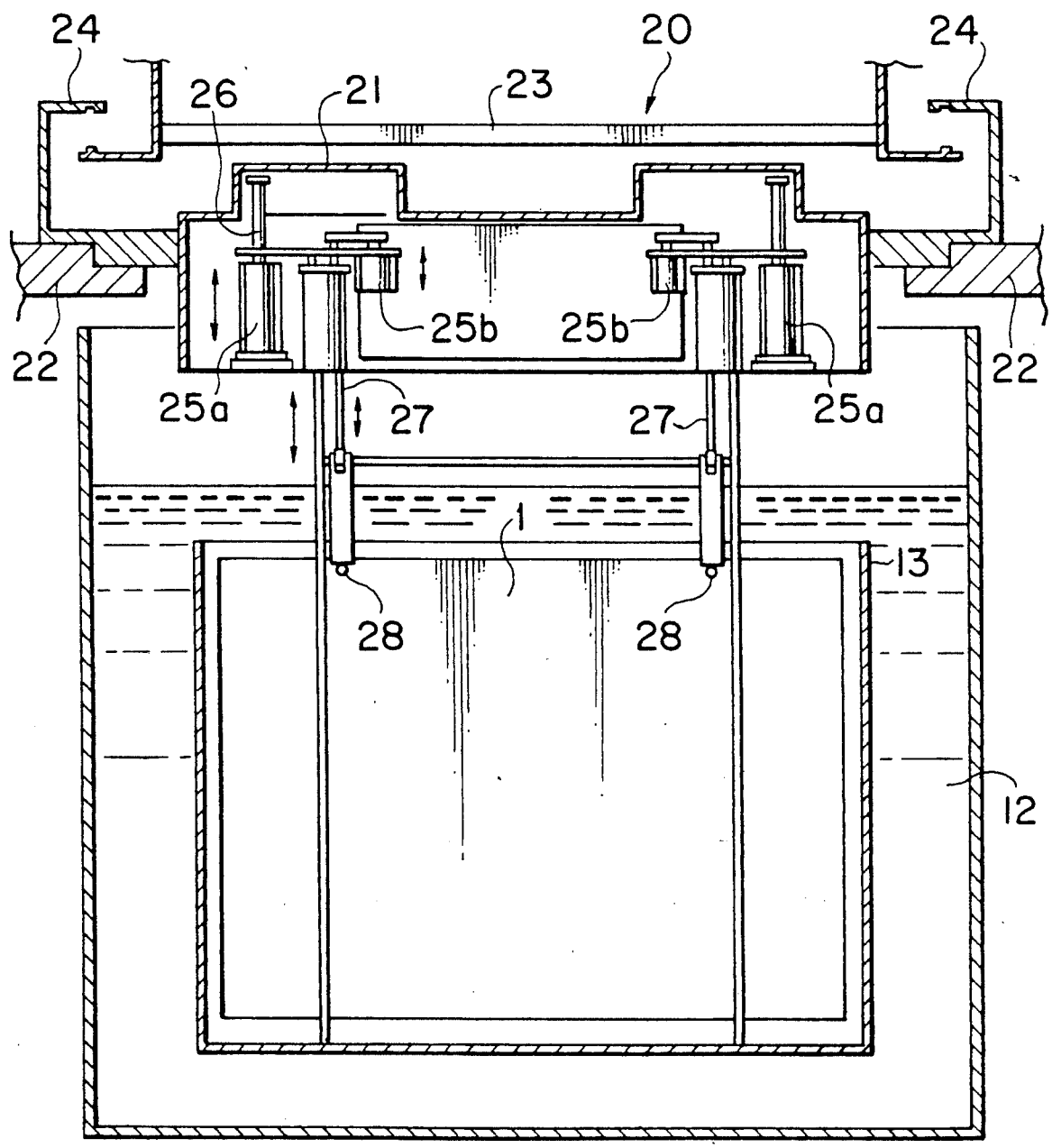
FIG. 4 is an explanatory view showing a treating apparatus of one embodiment of the present invention.

In order to realize the treating method for the interior surfaces of the holes as previously described, a treating apparatus 20 includes the treating tank 11 for containing the treating liquid 12 such as copper plating liquid and the finned cage 13 which serves as a holding member for holding a workpiece of the board 1 dipped in the treating liquid 12, as shown in FIG. 4. A movable block 21 is located above the treating tank 11, and the finned cage 13 is suspended from this movable block 21. The movable block 21 is mounted on arm holders 22 in the embodiment illustrated in FIG. 4. An actuator arm 23 is located above the movable block 21 so that lift arms 24 each having an L-shaped cross section which protrudingly extend from the movable block 21 can be displaced upwardly, as viewed in this figure.

That is to say, as the actuator arm 23 is moved upwardly, the finned cage 13 hung from the movable block 21 is then moved upwardly, and accordingly the board 1 can be lifted out of the treating liquid 12.

The movable block 21 includes cylinders operated by two independent hydraulic circuits of first cylinders 25a and second cylinders 25b. Piston rods 26 of the first cylinders 25a are cooperated with the finned cage 13 so that the first cylinders 25a enable the whole finned cage 13 to repeat moving upwardly and downwardly in the treating liquid 12.

In addition, piston rods of the second cylinders 25b are cooperated with suspension arms 27 from which the board 1 is directly hung, and latching pawls (not shown) provided on the distal ends of the suspension arms 27 are engaged in guide holes 28 bored through end portions of the board 1, so that the board 1 can be displaced upwardly and downwardly in a separate motion from the finned cage 13.

Next, the operation of the treating apparatus 20 of the above structure will be explained.

First, the finned cage 13 suspended from the movable block 21 within which the printed circuit board 1 has been carried is subjected to plating pretreatment, and then dipped in the treating liquid 12 within the treating tank by the operation of the actuator arm 23.

After that, in response to a command from operation controlling means (not shown), the first cylinders 25a are operated to move the finned cage 13 upwardly and downwardly, as viewed in the drawing. In such stroke motions S, when the finned cage 13 is moved upwardly, the treating liquid 12 moves along both of the fins 13a and the crossbeams 14a connected hereto, passes through the windows 15 of the finned cage 13, and flows into the inside of the cage, so that a flow of the liquid flowing along one side of the printed circuit board 1 becomes faster than a flow of the liquid flowing along the other side of the board, thereby creating flow velocity difference, i.e., pressure difference between these flows of the liquid along both sides of the printed circuit board 1. On the other hand, when the cage 13 is moved downwardly, the treating liquid 12 moves along the fins 13b as well as the crossbeams 14b connected hereto, passes through the windows 15 of the finned cage 13, and flows into the inside of the cage, so that the flow of the liquid flowing along the latter side of the printed circuit board 1 becomes faster than the flow of the liquid flowing along the former side of the board, thereby likewise causing flow velocity difference or pressure difference between these flows of the liquid along both sides of the printed circuit board 1. Thus, by such upward and downward movements or the stroke motions S of the finned cage 13, the treating liquid 12 in the through holes 2 of the printed circuit board 1 is caused to flow, and circulation of the treating liquid 12 through the holes 2 is promoted.

Although the calculation result of the formula (4) mentioned before only indicates the effect of such stroke motions by the first cylinders 25a in the movable block 21, this embodiment is arranged not only for the above-described stroke motions S but also to cause the printed circuit board 1 in the finned cage 13 to move upwardly and downwardly (U/D) with respect to the finned cage 13 by means of the second cylinders 25b.

In other words, after the stroke motions S of the finned cage 13 by the first cylinders 25a for a certain period of time, the second cylinders 25b are operated to displace the printed circuit board 1 alone upwardly or downwardly (U/D) at the inside of the finned cage 13 for a predetermined distance, e.g., about 2 to 10 mm. When the displacement of the printed circuit board 1 with respect to the finned cage 13 has been completed in this manner, the stroke motions S of the finned cage 13 are again started by the above first cylinders 25a. At this time, because the printed circuit board 1 is newly located at a position different from the initial position in the finned cage 13, the treating liquid 12 flowing through the windows 15 moves against the printed circuit board 1 in a regulated condition, and the treating liquid 12 satisfactorily circulates through the holes 2 of the printed circuit board 1.

Although the upward/downward displacement by the operation of the second cylinders 25b is explained above only in the case of upward or downward displacement for a predetermined distance, repeated displacements may be also effective in the same manner as the movements by the first cylinders 25a. The point is to change the condition of the liquid flow formation.

In this embodiment, other than the above-stated repeated motions by the first cylinders 25a and the upward/downward displacement by the second cylinders 25b, the arm holders 22 on which the movable block 21 is hung are displaced in a right and left direction or a forward and backward direction, as viewed in FIG. 1, so as to add variation to the liquid flows and further increase the treatment efficiency.

In experiments performed by the inventors of the present invention, after the finned cage 13 holding the printed circuit board 1 therein had been repeatedly moved by the first cylinders 25a alone for plating treatment, in which a desired value of plating thickness was 30 μm, and subjected to cleaning treatment, when the printed circuit board 1 was taken out of the finned cage 13 for observing sections of the through holes 2, if the holes had an aspect ratio (a thickness of the circuit board of 1/a diameter of each through hole 2) of 20 or more, approximately 10% of the total through holes 2 of the circuit board 1 were found to have plating covering ratios (a plating covering ratio is a plating thickness at the intermediate area of each through hole 2/a plating thickness at an end of the through hole 2) of 90% or so. In this case, the through holes 2 which had insufficient covering ratios are located horizontally between bent portions 16a, 16b on both sides of the finned cage 13 where the fins 13a, 13b are bent from the crossbeams 14a, 14b.

On the other hand, when the previously described treating method and its apparatus shown in FIG. 4 were employed, if combined operation of the repeated movements by the first cylinders 25a, the upward/downward displacement by the second cylinders 25b, and the displacement of the arm holders 22 was carried out, the through holes 2 which had been located between the bent portions 16a, 16b were shifted to different positions, and as a result, 100% of the total through holes 2 of the circuit board 1 had plating covering ratios of substantially 100%.

It was thus found that higher efficiency of the treatment can be obtained if the printed circuit board 1 is displaced within the treating liquid 12 by the combined operation of different movements to add variation to the liquid flows.

The present invention accomplished by the inventors has been concretely explained heretofore with reference to the preferred embodiments, but it goes without saying that the present invention is not restricted within these embodiments, and can be altered in various manners within a range of the essential points.

For instance, these three kinds of displacements by the first cylinders 25a, the second cylinders 25b, and the arm holders 22 may be respectively conducted in separate operations as previously described in the embodiments, or they may be performed simultaneously.

Besides, in the above embodiments, such a case is explained that the thick-covering chemical copper plating liquid is used as the treating liquid 12 for the through holes of the printed circuit board, but it may be also applicable to use etching liquid for metal, resin, or glass, e.g., smear removing liquid of potassium permanganate ($KMnO_4$) for removing smears or residual resin which has remained within the through holes during drilling them through the circuit board.

In the above-described treating apparatus, the liquid flows are created at both ends of the through holes to be treated due to the function of the fins in accordance with the repeated movements of the holding member of the workpiece, and these liquid flows are changed by shifting the holding position of the workpiece, so as to ensure the circulation of the treating liquid through the through holes to be treated, and enable the uniform treatment of these through holes by the treating liquid, thereby attaining highly reliable treatment.

What is claimed is:

1. A method for treating the interior surfaces of holes as well as the surfaces of a perforated workpiece by dipping it into treating liquid, which comprises providing a holding member adapted to be dipped in the liquid not only to hold the workpiece, but also to locate plate-like fins adjacent both ends of the holes of said workpiece, said fins adjacent a first side of the hole ends extending outwardly upwardly with respect to said holes, whereas said fins adjacent a second side of the hole ends extending outwardly downwardly with respect to said holes, repeatedly moving said holding member, including the workpiece, through the treating liquid, and shifting the workpiece to a different holding position relative to said holding member at least once when the holding member is repeatedly moved together with the workpiece within the treating liquid.

2. A method for treating the interior surfaces of holes as well as the surfaces of a perforated workpiece by dipping it into treating liquid, comprising the steps of locating the workpiece within the liquid in such a manner that said holes to be treated extend substantially in parallel to the liquid surface, providing fins at locations adjacent both ends of the holes, said fins adjacent one side of the hole ends extending outwardly upwardly, whereas said fins adjacent the other side of the hole ends extending outwardly downwardly, moving said workpiece within the liquid in a direction perpendicular to said holes to be treated, moving said workpiece within the liquid in a direction in parallel with these holes to be treated, and relatively shifting the position of the workpiece with respect to said fins.

3. An apparatus for treating the interior surfaces of holes on a perforated workpiece, comprising a holding member adapted to be dipped in liquid for holding a workpiece, fins provided on this holding member at locations adapted to be adjacent both ends of holes of a workpiece when a workpiece is disposed in said holding member, means for repeatedly moving said holding member, and means for enabling separate movement of the workpiece upwardly and downwardly with respect to said holding member.

4. An apparatus for treating the interior surfaces of holes on a perforated workpiece, comprising a holding member adapted to be dipped in liquid for holding a workpiece, fins provided on this holding member at locations adapted to be adjacent both ends of holes of the workpiece when the workpiece is disposed in said holding member, wherein said fins adapted to be adjacent a first side of the ends of workpiece holes when a workpiece to disposed in said holding member extend outwardly upwardly with respect to these holes, and said fins adapted to be adjacent a second side of the ends of workpiece holes when a workpiece is disposed in said holding member holes extend outwardly downwardly with respect to these holes, and further comprising means for repeatedly moving said holding member, and means for enabling separate movement of the workpiece upwardly and downwardly with respect to said holding member.

5. An apparatus for treating the interior surfaces of holes on a perforated workpiece according to claim 3, wherein said holding means is adapted to position the workpiece in the liquid so that the holes of a workpiece extend substantially horizontally.

6. A method for treating the interior surfaces of holes as well as the surfaces of a perforated workpiece by dipping it into treating liquid, which comprises causing the liquid to flow at both ends of said holes in a direction perpendicular to these holes at different velocities, wherein said workpiece is dipped in different velocities, wherein said workpiece is dipped in the liquid so that the holes to be treated extend substantially horizontally, and plate-like fins are alternately moved along both ends of said holes upwardly and downwardly.

7. A method for treating the interior surfaces of holes as well as the surfaces of a perforated workpiece by dipping it into treating liquid, which comprises causing the liquid to flow at both ends of said holes in a direction perpendicular to these holes at different velocities, wherein when said workpiece is held so that the holes to be treated extend substantially horizontally, the workpiece is placed in holding member having a finned structure whose plate-like fins extend at locations adjacent both ends of said holes, said plate-like fins adjacent one side of the hole ends extending downwardly at a certain angle, whereas said plate-like fins adjacent the other side of the hole ends extending upwardly at a certain angle, and this holding member is intermittently moved within said treating liquid upwardly and downwardly.

8. A method for treating the interior surfaces of holes as well as the surfaces of a perforated workpiece by dipping it into treating liquid, which comprises causing the liquid to flow at both ends of said holes in a direction perpendicular to these holes at different velocities, wherein said workpiece is dipped in the liquid so that the holes to be treated extend substantially horizontally, and plate-like fins are moved upwardly and downwardly along one side of the ends of said holes.

* * * * *

UNITED STATES PATENT AND TRADEMARK OFFICE
CERTIFICATE OF CORRECTION

PATENT NO. : 5,045,353
DATED : September 3, 1991
INVENTOR(S) : Yuuzi Takada, et. al.

It is certified that error appears in the above-identified patent and that said Letters Patent is hereby corrected as shown below:

Column 1, line 55, after "holes" insert --,--.
Column 2, line 43, change "smalldiameter" to --small-diameter--.
Column 4, line 55, change "$V_2= 0, Z_1 = Z_1,$" to --$V_2 = 0, Z_1 = Z_1,$--.
Column 5, line 31, change "take" to --produce the--.
Column 5, line 42 change "take" to --produce the--.
Column 7, line 44, after "board" delete "of", change "20" to --20%--.
Column 9, line 15, change "to" to --is--.
Column 10, line 3, delete "wherein said workpiece is dipped in different volocities,".

Signed and Sealed this

Fourth Day of May, 1993

Attest:

MICHAEL K. KIRK

Attesting Officer

Acting Commissioner of Patents and Trademarks